US009088294B2

(12) United States Patent
Mattes

(10) Patent No.: US 9,088,294 B2
(45) Date of Patent: Jul. 21, 2015

(54) APPARATUS AND METHOD FOR THE CHARACTERIZATION OF ANALOG-TO-DIGITAL CONVERTERS

(71) Applicant: Infineon Technologies AG, Neubiberg (DE)

(72) Inventor: Heinz Mattes, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/272,477

(22) Filed: May 7, 2014

(65) Prior Publication Data
US 2014/0333464 A1 Nov. 13, 2014

(51) Int. Cl.
*H03M 1/10* (2006.01)
*H03M 1/12* (2006.01)

(52) U.S. Cl.
CPC .............. *H03M 1/1071* (2013.01); *H03M 1/12* (2013.01)

(58) Field of Classification Search
CPC ... H03M 1/12; H03M 1/0617; H03M 1/1071; H03M 1/1085; H03M 3/43; H03M 3/448
USPC ..................... 341/18, 120, 130, 139, 140, 155
See application file for complete search history.

(56) References Cited

U.S. PATENT DOCUMENTS

| | | | | | |
|---|---|---|---|---|---|
| 5,623,263 | A | * | 4/1997 | Kuo et al. | 341/143 |
| 5,631,646 | A | * | 5/1997 | Erhage | 341/120 |
| 7,551,666 | B2 | * | 6/2009 | Mori et al. | 375/219 |
| 7,808,411 | B2 | * | 10/2010 | Groiss | 341/138 |
| 7,839,314 | B2 | * | 11/2010 | Cetin et al. | 341/120 |
| 2009/0007661 | A1 | * | 1/2009 | Nasiri et al. | 73/504.03 |
| 2009/0058705 | A1 | * | 3/2009 | Cetin et al. | 341/155 |

* cited by examiner

*Primary Examiner* — Linh Nguyen
(74) *Attorney, Agent, or Firm* — SpryIP, LLC

(57) ABSTRACT

A method and apparatus for characterizing an A/D converter are provided. The A/D converter is configured to convert an input signal into a digital output signal. The method and apparatus may provide: applying an input signal to the A/D converter that in a first phase at least includes a gradient of a rising exponential function with Euler's number as the base, and in a further phase has a profile of a falling exponential function with Euler's number as the base, integrating a digital output signal associated with the A/D converter during the first phase to provide a first sum, integrating the digital output signal associated with the A/D converter during the further phase to provide a second sum, and calculating from the first sum and the second sum at least a gain error of the A/D converter and/or a zero point error of the A/D converter.

17 Claims, 2 Drawing Sheets

APPARATUS AND METHOD FOR THE CHARACTERIZATION OF ANALOG-TO-DIGITAL CONVERTERS

RELATED APPLICATIONS

This application claims priority of German patent application number 10 2013 007 903.9. The entire contents of the German patent application are hereby incorporated herein by reference.

BACKGROUND

The subject matter of this application generally relates to an apparatus and method for calculating parameters associated with analog-to-digital (A/D) converters.

Complex system-on-chip (SoC) components, such as microcontrollers for automotive applications, include a plurality of A/D converters. It is desirable that their functionality be checked during a production test. It may be advantageous that in the future, in addition, a test can be carried out during normal operation of the vehicle in the installed state. Methods are known in which a linearly rising signal is applied to one input of a test A/D converter. From the comparison of the output signal of the A/D converter with expected values it is possible to determine offset errors (also called zero point errors) and gain errors associated with the A/D converter.

SUMMARY

Therefore, it may be desirable to provide a method that requires a minimum effort for the test. It may be particularly desirable to provide a test method that may be provided or loaded into a block to be tested (device under test, DUT).

In one embodiment, a method of characterizing an A/D converter is provided. The A/D converter is configured to convert an input signal into a digital output signal. The method may comprise: applying an input signal to the A/D converter that in a first phase at least includes a gradient of a rising exponential function with Euler's number as the base, and in a further phase has a profile of a falling exponential function with Euler's number as the base, integrating a digital output signal associated with the A/D converter during the first phase to provide a first sum, integrating the digital output signal associated with the A/D converter during the further phase to provide a second sum, and calculating from the first sum and the second sum at least a gain error of the A/D converter and/or a zero point error of the A/D converter.

In another embodiment, an electronic circuit is provided to characterize A/D converter. The A/D converter is capable of converting an analog input signal to a digital output signal. The electronic circuit may include a generator for providing an input signal. The input signal to the A/D converter may in a first phase at least include a gradient of a rising exponential function with Euler's number as the base, and in a further phase, the input signal may include a profile of a falling exponential function with Euler's number as the base. The electronic circuit may further include an integrator to integrate a digital output signal associated with the A/D converter during the first phase to provide a first sum, the integrator to further integrate the digital output signal associated with the A/D converter during the further phase to provide a second sum. Furthermore, the electronic circuit may include a calculation unit for calculating from the first sum and the second sum at least a gain error of the A/D converter and/or a zero point error of the A/D converter.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
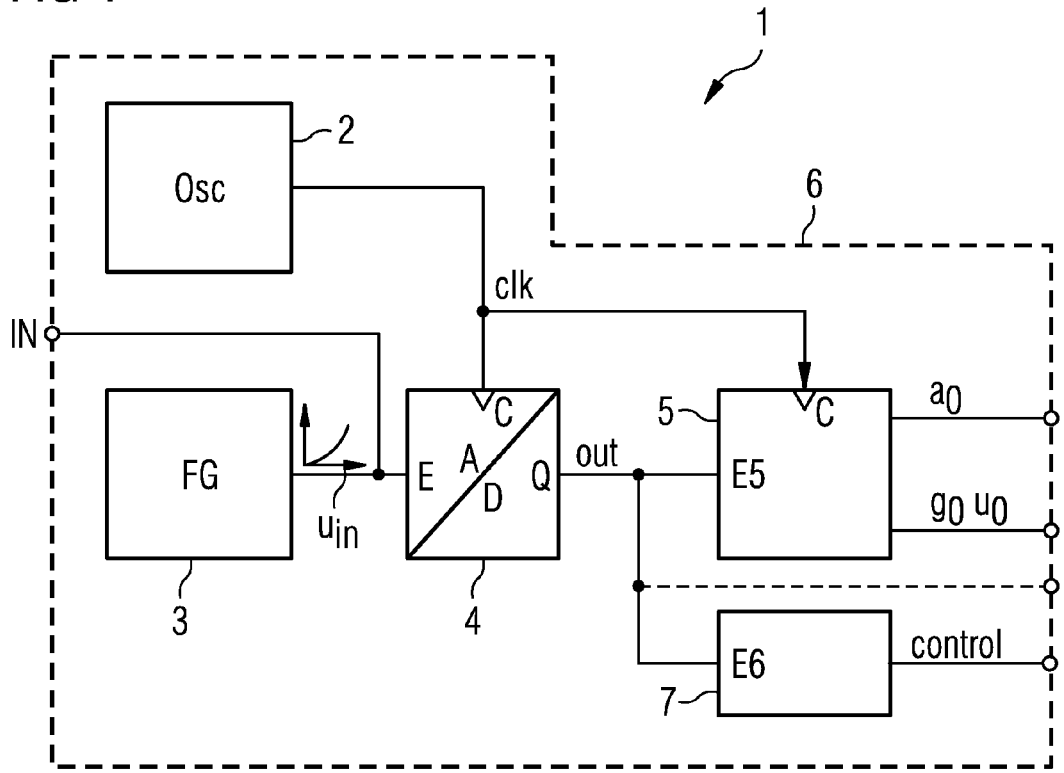
FIG. 1 illustrates an exemplary schematic diagram of a circuit for determining zero point errors and/or gain errors of an A/D converter under test.

A device 1 is illustrated in FIG. 1. The device 1 is configured to test an A/D converter 4. The device 1 may include, in addition to the A/D converter 4, an oscillator to, a function generator 3, a detector circuit 5 and a control circuit 7. The various elements of the device 1 may be monolithically integrated as an integrated circuit 6. In one embodiment, all the elements of the device 1, except for the A/D converter 4, are monolithically integrated as an integrated circuit. That is, the A/D converter 4 may be implemented as a separate component from the other elements of the device 1. In yet another embodiment, one or more elements of the device 1 is a separate component.

As is illustrated in FIG. 1, the A/D converter 4 includes inputs E and C. The E input is to receive data. The C input is to receive a clock signal (CLK). The A/D converter 4 also includes an output Q. The E input of the A/D converter 4 is coupled to an input IN of the integrated circuit 6. The oscillator 2 outputs the clock signal to the input C of the A/D converter 4. The function generator 3 provides an analog signal ($u_{in}$) at an output thereof. The output of the function generator 3 is coupled to the input E of the A/D converter 4. The output Q of the A/D converter 4 is coupled to an input E5 of the detector circuit 5. In addition, the output Q of the A/D converter 4 is coupled to an input E6 of the control circuit 7.

The oscillator 2 generates the clock signal during both a normal operation as well as in a test operation. The clock signal is received by the A/D converter 4 at the input C. The clock signal received by the A/D converter 4 is used by the converter 4 as a sampling clock signal. The A/D converter 4 converts analog signals received at the input E to digital signals in accordance with the sampling rate of the sampling clock signal received thereby. The digital signals are provided on the output Q.

As part of a normal operation of the integrated circuit 6, the circuit 6 receives an analog signal which is converted by the A/D converter 4 into a digital signal OUT. The function generator 3 switches its output to a high impedance level. The digital signal OUT is received by the control circuit 7 and is used to generate a control signal (control) that is output by the integrated circuit 6. The control signal may be used to control an actuator of a controller unit, which is not illustrated in FIG. 1. As an alternative embodiment, as is shown by the dashed line coupled to the output Q of the A/D converter 4, the digital signal OUT may bypass the control circuit 7 and therefore be provided directly to an output of the integrated circuit 6.

As part of a test operation of the integrated circuit 6, the signal $u_{in}$ is provided by the function generator 3. In this particular embodiment of operation, a signal is not provided on the input IN of the integrated circuit 6. Therefore, the signal $u_{in}$ received at the input E of the A/D converter 4. The signal $u_{in}$ is converted from an analog form to a digital form by the A/D converter 4 and output as the digital signal OUT output Q. The digital signal OUT is received by the detector circuit 5, which generates in accordance with the digital signal OUT a zero point error signal $a_0$ and a gain error signal $g_0$ $u_0$. The values of $a_0$ and $g_0$ $u_0$ can be output to control circuits external to the integrated circuit 6, which generate an error message if the values $a_0$ and/or $g_0$ $u_0$ are outside a predetermined range. In an alternative, the values may be used to calibrate the ATD converter 4. The evaluation circuit 5 also receives the clock signal CLK at a clock input C of the evaluation circuit 5.

Figure 2:
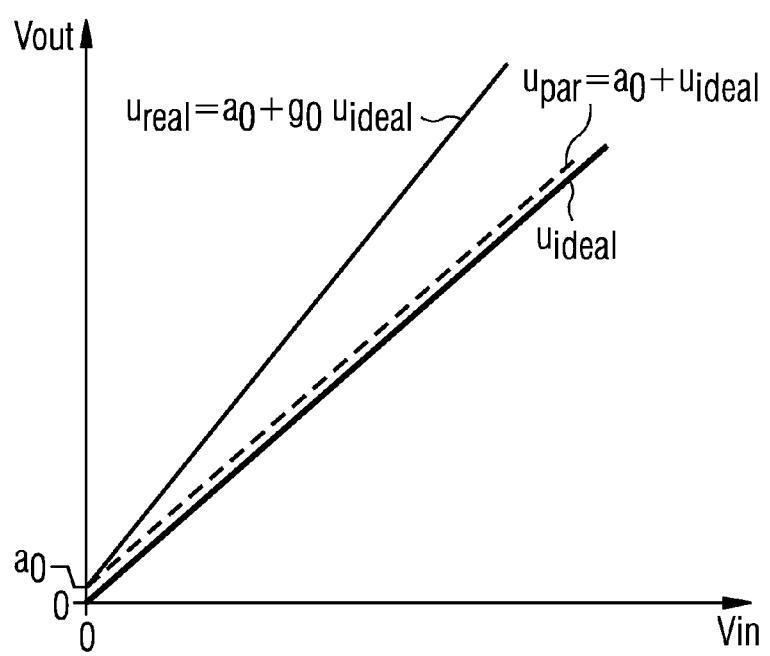
FIG. 2 illustrates a curve associated with output voltages of an A/D converter.

FIG. 2 shows the variation of an output voltage Vout of an A/D converter, such as the A/D converter 4, in response to the input voltage Vin of the A/D converter. In all graphs shown in FIG. 2 provide a simplified representation of various signals; quantization is not shown. That is, the curves are drawn with straight lines, whereas output voltages of actual A/D converters generally have a stepped response, or non-flat profile. In the figure, a curve is shown $u_{ideal}$ that starts at the origin and has a linear trend. A $u_{par}$ curve starts, with an input voltage Vin of zero volts, at a voltage $a_0$, which is referred to as a zero error or offset. The $u_{par}$ curve is parallel to $u_{ideal}$ curve. Thus uPAR shows an output voltage of an A/D converter, where the gain error is zero. The $u_{real}$ curve shows the profile of an analog- to-digital converter, the offset error is greater than zero, namely $a_0$, and the gain error is larger than zero. Using the circuit shown in the figures, these errors can be determined.

Figure 3:
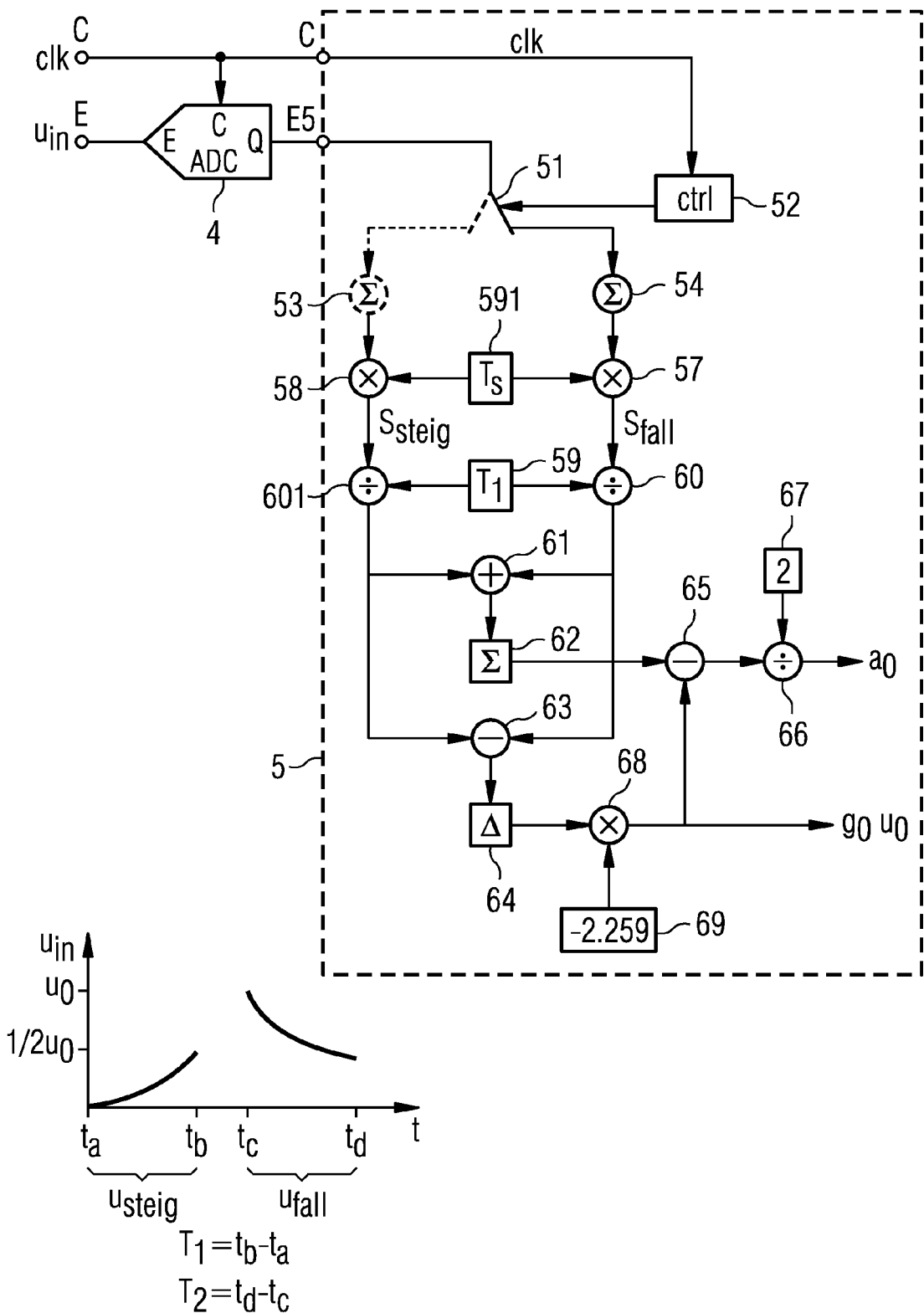
FIG. 3 illustrates an exemplary embodiment of the circuit illustrated in FIG. 1.

FIG. 3 illustrates an exemplary implementation of a portion of the circuit 1 illustrated in FIG. 1. As is illustrated, the A/D converter 4 is provided in FIG. 3. Furthermore, a detailed implementation of the evaluation circuit 5 is provided in FIG. 3. As was discussed in FIG. 1, the evaluation circuit 5 receives a clock signal CLK at the input C and a digital signal at the input E5. The evaluation circuit 5 include a switch 51, a control circuit 52, 2 summers 53 and 54, 2 multipliers 58 and 57, a memory 591, a memory 59, a divider 60, a divider 601, an adder 61, a memory 62, a subtracter 63, a memory 64, a subtracter 65, a divider 66, a memory 67, a multiplier 68 and a memory 69.

The input signal $u_{in}$ is applied to the data input E of the A/D converter 4. The rise and fall of the input signal $u_{in}$ is shown in the graph associated with FIG. 3. As is illustrated, the input signal $u_{in}$ is in a first phase between times $t_a$ and $t_b$ ($u_{steig}$). The exponential increase of the input signal $u_{in}$ is at least associated with Euler's number. In a further phase, between times $t_c$ and $t_d$ ($u_{fall}$), the exponential decrease of the input signal is also at least associated with Euler's number. The function for $u_{steig}$ is provided by the following formula:

$$u_{steig}(t) = u_0(1 - e^{\frac{-t}{\tau}})$$

The function for $u_{fall}$ is i provided by the following formula:

$$u_{fall}(t) = u_0 e^{\frac{-t}{\tau}}.$$

The values $u_0$ and $\tau$ are considered to be constants. The value $u_0$ is chosen such that it is at or within a maximum voltage or voltage range of the A/D converter 4.

As should be understood, in various embodiments, the first and further phases may be switched. For example, the first phase may be between times $t_c$ and $t_d$ ($u_{fall}$) and proceed the further phase between times $t_a$ and $t_b$ ($u_{steig}$).

The input of the changeover switch 51 is connected to the output E of the A/D converter 4. The control circuit 52 switches the switch 51 so that the output of the switch 51 is selectively connected to the input of the summing element 53 and to the input of the summing element 54. The summers 53 and 54 add the value applied to its input to a respective register value, respectively. The timing of the addition can be determined in each case by the control circuit 52, this also controls a reset, that is, the setting of the register value to zero, if required.

The output of the summing element 53 is connected to a first input of the multiplier 58, while the second input of the multiplier 58 is connected to an output of the memory 591. The output of the summing element 54 is connected to a first input of the multiplier 57, while the second input of the multiplier 57 is connected to the output of the memory 591.

The output of multiplier 58 is connected to a first input of a divider unit 601, whose second input is connected to the output of the memory 59. The divider unit 601 divides the output value of the multiplier 58 by the contents of the memory 59, the output of the multiplier 57 is connected to a first input of divider unit 60, whose second input is connected to the output of the memory 59. The divider unit 60 divides the output of the multiplier 57 by the contents of memory 59.

The output signal of the divider unit 601 and the output of the divider unit 60 are each connected to an input of the adder 61, which outputs the sum of the two output signals to the memory 62. This memory 62 stores the received value as E.

The output signal of the divider unit 601 and the output of the divider unit 60 are also respectively connected to one input of the subtracter 63, which outputs the difference between the values of the output signals to the memory 64. This memory 64 stores the received value as A.

The output of memory 64 is connected to a first input of the multiplier 68 whose second input is connected to the output of the memory 69. The output of memory 64 is the one with the output $g_0$ $u_0$ and secondly connected to the second input of the subtracter 65. The first input of the subtractor 65 is connected to the output of the memory 62. The output of subtractor 65 is connected to a first input of a divider unit 66, whose second input is connected to an output of the memory 67. The dividing unit 66 divides the value present at its first input with the value present at its second input, and outputs it as $a_0$.

The adder 61 outputs at its output the sum of the values at its inputs. The multipliers each provide at their outputs the product of the values at their inputs. The multipliers 58, 57, 68, the adders 61, the divider units 60, 601, 66 and the subtracters 63 and 65 are each designed as digital circuits. They may each contain one, not shown in the FIG. 3, a clock input that determines the time at which the respective processing operation is performed. These clock inputs are connected to outputs of the control circuit 52, not shown in this FIG. 3.

Alternatively, the multipliers and dividers can be implemented by a central processing unit. The central processing may be switched in such a way that in a first time window, the calculations of the units 53, 58 and 601 are performed, and the calculations carried out by the units 54, 57 and 60 are performed in a second time window.

The embodiment illustrated in the figures, in particular FIG. 3, consider falling considerations.

As input signals, rising and falling exponential functions will be used, taking advantage of the special properties of the exponential function with the Euler's number as a base. The rising and falling edge of an exponential function with the amplitude $u_0$ and the time constant $\tau$ are described by the following two relations.

$$u_{steig,ideal}(t) = u_0(1 - e^{\frac{-t}{\tau}}) \quad \text{Formula 1}$$

$$u_{fall,ideal}(t) = u_0 e^{\frac{-t}{\tau}} \quad \text{Formula 2}$$

The time constant $\tau$ is the same for both curves. If an A/D converter has a zero error a0 and a gain error g0, the following voltages of the rising edge and the falling edge are provided:

$$u_{steig}(t) = a_0 + g_0 u_0(1 - e^{\frac{-t}{\tau}}) \quad \text{Formula 3}$$

$$u_{fall}(t) = a_0 + g_0 u_0 e^{\frac{-t}{\tau}} \quad \text{Formula 4}$$

The method is based on the formulation or formation of sums over defined measurement interval. The rising and falling values from time t=T0 to t=T0+T1 are given by the following.

$$S_{steig} = \int_{t=T_0}^{T_0+T_1} u_{steig}(t)dt$$
$$= \int_{t=T_0}^{T_0+T_1} \left(a_0 + g_0 u_0(1 - e^{\frac{-t}{\tau}})\right)dt$$
$$= \int_{t=T_0}^{T_0+T_1} (a_0 + g_0 u_0)dt - \int_{t=T_0}^{T_0+T_1} g_0 u_0(e^{\frac{-t}{\tau}})dt$$
$$= (a_0 + g_0 u_0)t \Big|_{T_0}^{T_0+T_1} + g_0 u_0 \tau(e^{\frac{-t}{\tau}}) \Big|_{T_0}^{T_0+T_1}$$
$$= (a_0 + g_0 u_0)T_1 + g_0 u_0 \tau \left(e^{\frac{-(T_0+T_1)}{\tau}} - e^{\frac{-T_0}{\tau}}\right)$$
$$= (a_0 + g_0 u_0)T_1 - g_0 u_0 \tau e^{\frac{-T_0}{\tau}}\left(1 - e^{\frac{-T_1}{\tau}}\right)$$

$$S_{fall} = \int_{t=T_0}^{T_0+T_1} u_{fall}(t)dt$$
$$= \int_{t=T_0}^{T_0+T_1} \left(a_0 + g_0 u_0 e^{\frac{-t}{\tau}}\right)dt$$
$$= \int_{t=T_0}^{T_0+T_1} a_0 dt + \int_{t=T_0}^{T_0+T_1} g_0 u_0(e^{\frac{-t}{\tau}})dt$$
$$= a_0 t \Big|_{T_0}^{T_0+T_1} + g_0 u_0 \tau(e^{\frac{-t}{\tau}}) \Big|_{T_0}^{T_0+T_1}$$
$$= a_0 T_1 - g_0 u_0 \tau \left(e^{\frac{-(T_0+T_1)}{\tau}} - e^{\frac{-T_0}{\tau}}\right)$$
$$= a_0 T_1 + g_0 u_0 \tau e^{\frac{-T_0}{\tau}}\left(1 - e^{\frac{-(T_1)}{\tau}}\right)$$

Next, the sum $\Sigma S$ and the difference $\Delta S$ of the two integration results are given by following.

$$\sum S = S_{steig} + S_{fall} = (2a_0 + g_0 u_0)T_1$$

$$\Delta S = S_{steig} - S_{fall} = g_0 u_0 T_1 - 2g_0 u_0 \tau e^{\frac{-T_0}{\tau}}\left(1 - e^{\frac{-T_1}{\tau}}\right)$$

$T_0$ and $T_1$ can now be selected in this embodiment so that the following relations hold:

$$T_1 = \tau \ln(2) \to e^{\frac{-T_1}{\tau}} = \frac{1}{2}$$

$$T_0 = 0 \to e^{\frac{-T_0}{\tau}} = 1$$

Based on the curves in FIG. 3, this means that at the instants to and tc, t each is set to zero, and that tb−ta=td−tc=τ ln (2). Therefore the following may be provided for $\Sigma S$ and $\Delta S$ as:

$$\frac{\Delta S}{T_1} = \Delta = g_0 u_0 - g_0 u_0 \frac{1}{\ln(2)} = g_0 u_0 \left(1 - \frac{1}{\ln(2)}\right) \approx -0.4427 g_0 u_0$$

$$\frac{\sum S}{T_1} = \sum = 2a_0 + g_0 u_0 = 2a_0 - \frac{\Delta}{0.447} \approx 2a_0 - 2.259\Delta,$$

where $g_0$ is a dimensionless number that indicates the gain. When $g_0$=1 in the gain error is zero, that is, the gain of the A/D converter is ideal. The product is the gain $g_0$ $u_0$ times the swept area of the input signal $u_{in}$. The value $a_0$ has the dimension of volts and returns the zero-point error.

For desired values, the following are provided:

$$g_0 u_0 \approx -\frac{\Delta}{0.4427} = -2.259\Delta$$

$$a_0 \approx \frac{\sum + 2.259\Delta}{2}$$

For a practical implementations, the equations will be mapped to a hardware structure, as shown for example in FIG. 3.

Consequently, the values −2.259 and 2 in are stored the memories 69 and 67.

In the example shown, the integration is aided by the summing units 53 and 54 and the multipliers 57 and 58. The summers will each receive a register. In this register, a register content is stored in the form of a binary number. If the summers receives a rising clock edge at a clock input, the voltage applied to a data input of the summing value is added to the register content and saved the result of this addition as the new register contents. At the end of the measurement, the respective register content is multiplied by one of the multipliers 57 and 58 by the constant factor TS. The output signal of the multiplier 58 corresponds to a first sum and $S_{steig}$ the output of the multiplier 57 corresponds to a second sum $S_{fall}$.

The at the clock input of the summing elements 53 and 54 corresponds to the clock CLK, and hence the sampling rate of the A/D converter 4, the stored value in the memory is equal to the period of the clock CLK.

In further not shown embodiments, the summing elements 53 and 54 are operated at a higher frequency than the CLK and therefore a value stored in the memory 591 corresponding to $T_s$ is smaller than the period length of CLK.

In one implementation, the clock inputs of the multipliers 58, 57, 68, adders 61, 65, the divider units 60, 601, 66 and the subtracter 65 are supplied with a clock having a lower frequency as CLK. In the embodiment shown, the circuits receive a clock signal only once during a measurement and, in particular in one example, when the first and second phases are over. For this purpose, a counter is provided in the control circuit 52, which counts up to the end of the second phase.

The integrating described herein may be accomplished by way of digital integration techniques. That is, an accumulation of products from respective signal values and the time interval from the previous signal value.

The embodiments shown in the figures, in some embodiments, the time interval between two additions is constant in the same as TS. For this reason, it is possible to initially add all the values to be added in succession to a register content to subsequently multiply the contents of register with TS. This can be illustrated with instructions in pseudo-code:

```
begin {
Register Contents: = 0;
from (t = T0) to (t ≥ T1 – tclk) Loop {t: = t + tclk; Register Contents: = register contents
+ out (t);} end loop;
result of integration = register contents * tclk;
end}
``` out (t) denotes the digital value that is output from the Q output of the AD converter, and the tclk period length of the clock CLK.

The single multiplication in the foregoing as compared to a multiple multiplying has the advantage that little power is consumed because usually a multiplication consumes more power than an addition.

In other embodiments, the addition is not carried out periodically at equidistant points in time, but also at non-equidistant times. In this case, the respective output of the A/D converter 4 is multiplied by the time difference to the previous time of calculation. The results of the multiplications are added to one another. The following pseudo-code will illustrate this:

```
begin {
register Contents: = 0;
from (t = T0) to (t ≥ T1 TABT) Loop {t: = t + TABT; Register
Contents: = register
contents + E * TABT;} end loop;
resolved of integration = register contents;
end}
```

The TABT refers to the time difference from the preceding sampling time. If the time points are non-equidistant to each other, the followed varies TABT.

However, the latter method of calculation may be used for both equidistant points in time as well as non-equidistant consecutive time points.

The implementations provided provide the determination of the gain error and rounding errors. When the values for these parameters are determined, these values can include quantization by the analog to digital converter and rounding errors. To minimize these rounding errors, it can be useful in certain embodiments, for an A/D converter, for example, to select a value other than zero for T0 to start measuring something later.

An embodiment of the method can be summarized as follows:

It will be used for exponential functions with a known amplitude $u_0$ and a known time constant $\tau$ as stimuli for the A/D converter.

The output code of the A/D converter are added up for the rising and falling edge over specific time periods.

From the differences in the sums, the offset error and the gain error result may be found, and after the subtraction or a division is carried out by a known factor.

Certain embodiments have the following properties:

The function values of the exponential function correspond to the output codes of the tested ADC.

The amplitude $u_0$ corresponds to the number of possible output codes. In the case of an A/D converter with a resolution of B bits it is known that $u_0=2^B*$an increment of the A/D converter.

The exponential input signal of the ADC is sampled at a constant data rate fs and converted into a digital output code.

The time interval between two sampled values is equal to Ts=1/fs.

A counter controls the number of the sampled values.

The well-known time constant $\tau$ corresponds to $\tau=N\tau*fs$ pulses.

The period of time T1 corresponds NT1=ln (2)$\tau*$fs pulses.

NT and NT1 are rounded to whole numbers or sizes.

The digital output of the A/D converter is connected to at least one accumulator, which accumulates the output codes of a certain number of cycles.

The start and the end of the accumulation is controlled by a control unit.

Depending on the count, the flanks and further process conditions, the summers are switched on and off.

A multiplication unit scales the obtained values from the sums and differences to the final size.

Further exemplary examples have the following properties:

1. The tested A/D converter is fed with the falling and rising edges of an exponential function.
2. The amplitude of the exponential signals is known.
3. The arrangement comprises at least one register, wherein the A/D converter the falling edges of output value of the are accumulated.
4. The arrangement includes at least one register, wherein the A/D converter the rising edges of output value of the are accumulated.
5. The arrangement includes a control unit, which controls the procedure. In particular, the control unit determines whether the data on the rising or falling edge is to be processed, as well as the points in time at which the accumulation begins and ends.
6. The arrangement includes a number of computing units, for forming sums, differences, quotients, and products.
7. The arrangement includes a processor (central processing unit (CPU)), and the least part of the functional aspects of the computing units can be mapped into the processor in the form of a software program and executed by the CPU.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method characterizing an analog-to-digital converter, the analog-to-digital converter configured to convert an input signal to a digital output signal, the method comprising:

applying the input signal to the analog-to-digital converter that in a first phase at least includes a profile of a rising exponential function with Euler's number as the base, and in a further phase has a profile of a falling exponential function with Euler's number as the base;

integrating the digital output signal during the first phase to provide a first sum;

integrating the digital output signal during the further phase to provide a second sum; and calculating from the first sum and the second sum at least a gain error of the analog-to-digital converter and/or a zero-point error of the analog-to-digital converter.

2. The method according to claim 1, wherein the rising and falling exponential functions make use of a common time constant.

3. The method according to claim 1, further comprising scanning the input signal using a constant sampling frequency.

4. The method according to claim 1, wherein the rising exponential function is given by $$u(t) = u_0 * (1 - e^{\frac{-t}{\tau}}),$$

wherein t is time, $\tau$ is a time constant, $u_0$ is a constant, wherein $u_0$ is smaller than or equal to a size of an input range of the analog-to-digital converter.

5. The method according to claim 1, wherein the falling exponential function is given by $u(t)=u_0*e^{(-t/\tau)}$, wherein t is time, $\tau$ is a time constant, $u_0$ is a constant, wherein $u_0$ is smaller than or equal to a size of an input range of the analog-to-digital converter.

6. The method according to claim 1, wherein the first phase has a time duration of $T_1$ and the second phase has a time duration of $T_2$, $T_1=T_2=\ln(2)*\tau$, wherein $\tau$ is a time constant of the exponential functions.

7. The method according to claim 3, wherein the constant sampling frequency is greater than $2^B*1/(T_1)$, where $T_1$ is a time duration of the first phase and B is a resolution of the analog-to-digital converter.

8. The method according to claim 1, wherein calculating includes determining a difference value from the first sum and the second sum.

9. An electrical circuit for characterizing an analog-to-digital converter, the analog-to-digital converter configured to convert an input signal to a digital output signal, the electrical circuit comprising:

a generator to provide the input signal, the input signal in a first phase at least includes a profile of a rising exponential function with Euler's number as the base, and in a further phase has a profile of a falling exponential function with Euler's number as the base an integrator to integrate the digital output signal during the first phase 2 provide a first sum and to integrate the digital output signal during the further phase to provide a second sum;

a calculation unit to calculate from the first sum and the second sum at least a gain error of the analog-to-digital converter and/or a zero-point error of the analog-to-digital converter.

10. The electrical circuit according to claim 9, wherein the rising and falling exponential functions make use of a common time constant.

11. The electrical circuit according to claim 9, scanning the input signal has a constant sampling frequency.

12. The electrical circuit according to claim 9, wherein the rising exponential function is given by $$u(t) = u_0 * (1 - e^{\frac{-t}{\tau}}),$$

wherein t is time, $\tau$ is a time constant, $u_0$ is a constant, wherein $u_0$ is smaller than or equal to a size of an input range of the analog-to-digital converter.

13. The electrical circuit according to claim 9, wherein the falling exponential function is given by $u(t)=u_0*e^{(-t/\tau)}$, wherein t is time, $\tau$ is a time constant, $u_0$ is a constant, wherein $u_0$ is smaller than or equal to a size of an input range of the analog-to-digital converter.

14. The electrical circuit according to claim 9, wherein the first phase has a time duration of $T_1$ and the second phase has a time duration of $T_2$, $T_1=T_2=\ln(2)*\tau$, wherein $\tau$ is a time constant of the exponential functions.

15. The electrical circuit according to claim 11, wherein the constant sampling frequency is greater than $2^B*1/(T_1)$, where $T_1$ is a time duration of the first phase and B is a resolution of the analog-to-digital converter.

16. The electrical circuit according to claim 9, wherein the electrical circuit in the analog-to-digital converter are monolithically integrated.

17. The electrical circuit according to claim 9, wherein the calculation unit comprises a summation unit for calculating a sum from the first sum and the second sum and a difference unit for determining a difference between the first sum and the second sum.

* * * * *